US008747964B2

(12) United States Patent  
Park et al.

(10) Patent No.: US 8,747,964 B2
(45) Date of Patent: Jun. 10, 2014

(54) ION-INDUCED ATOMIC LAYER DEPOSITION OF TANTALUM

(75) Inventors: Kie Jin Park, San Jose, CA (US); Jeong Seok Na, San Jose, CA (US); Victor Lu, Foster City, CA (US)

(73) Assignee: Novellus Systems, Inc., Fremont, CA (US)

( * ) Notice: Subject to any disclaimer, the term of this patent is extended or adjusted under 35 U.S.C. 154(b) by 158 days.

(21) Appl. No.: 13/244,009

(22) Filed: Sep. 23, 2011

(65) Prior Publication Data

US 2012/0115325 A1 May 10, 2012

Related U.S. Application Data

(60) Provisional application No. 61/438,914, filed on Feb. 2, 2011, provisional application No. 61/438,497, filed on Feb. 1, 2011, provisional application No. 61/410,285, filed on Nov. 4, 2010.

(51) Int. Cl.  
*H05H 1/24* (2006.01)

(52) U.S. Cl.  
USPC .......................................... 427/576; 427/569

(58) Field of Classification Search  
USPC ................................. 427/576, 569  
See application file for complete search history.

(56) References Cited

U.S. PATENT DOCUMENTS

| 4,058,430 A | 11/1977 | Suntola et al. |
| 4,172,108 A | 10/1979 | Maeda |
| 4,389,973 A | 6/1983 | Suntola et al. |
| 4,895,107 A | 1/1990 | Yano et al. |
| 4,900,582 A | 2/1990 | Nakayama et al. |
| 4,965,090 A | 10/1990 | Gartner et al. |
| 4,975,252 A | 12/1990 | Nishizawa et al. |
| 4,985,657 A | 1/1991 | Campbell |
| 5,283,085 A | 2/1994 | Gartner et al. |
| 5,420,076 A | 5/1995 | Lee et al. |
| 5,438,587 A | 8/1995 | Kinley |
| 5,545,443 A | 8/1996 | Yamada et al. |
| 5,549,937 A | 8/1996 | Gartner |
| 5,711,811 A | 1/1998 | Suntola et al. |
| 5,820,664 A | 10/1998 | Gardiner et al. |
| 5,916,365 A | 6/1999 | Sherman |
| 5,939,150 A | 8/1999 | Stelzle et al. |

(Continued)

FOREIGN PATENT DOCUMENTS

| EP | 0015390 B1 | 9/1985 |
| WO | WO96/17969 | 6/1996 |

(Continued)

OTHER PUBLICATIONS

Schmidt et al. Atomic layer deposition of Ta—N-based thin films using a tantalum source, J Electrochem Soc, 157 (6) pp. H638-H642.*

(Continued)

*Primary Examiner* — Kelly M Gambetta  
(74) *Attorney, Agent, or Firm* — Weaver Austin Villeneuve & Sampson LLP

(57) ABSTRACT

Systems, methods, and apparatus for depositing a tantalum layer on a wafer substrate are disclosed. In one aspect, a tantalum layer may be deposited on a surface of a wafer substrate using an ion-induced atomic layer deposition process with a tantalum precursor. A copper layer may be deposited on the tantalum layer.

17 Claims, 3 Drawing Sheets

(56) References Cited

U.S. PATENT DOCUMENTS

| | | | |
|---|---|---|---|
| 6,015,590 | A | 1/2000 | Suntola et al. |
| 6,060,130 | A | 5/2000 | Kim |
| 6,200,893 | B1 | 3/2001 | Sneh |
| 6,238,739 | B1 | 5/2001 | Madar |
| 6,265,311 | B1 | 7/2001 | Hautala et al. |
| 6,267,074 | B1 | 7/2001 | Okumura |
| 6,277,745 | B1 | 8/2001 | Liu et al. |
| 6,335,063 | B1 | 1/2002 | Chen et al. |
| 6,368,678 | B1 | 4/2002 | Bluck et al. |
| 6,368,954 | B1 | 4/2002 | Lopatin et al. |
| 6,416,822 | B1 | 7/2002 | Chiang et al. |
| 6,428,859 | B1 * | 8/2002 | Chiang et al. ............... 427/457 |
| 6,459,501 | B1 | 10/2002 | Holmes |
| 6,464,779 | B1 | 10/2002 | Powell et al. |
| 6,472,023 | B1 | 10/2002 | Wu et al. |
| 6,475,276 | B1 | 11/2002 | Elers et al. |
| 6,482,262 | B1 | 11/2002 | Elers et al. |
| 6,500,772 | B2 | 12/2002 | Chakravarti et al. |
| 6,511,539 | B1 | 1/2003 | Raaijmakers |
| 6,518,195 | B1 | 2/2003 | Collins et al. |
| 6,569,501 | B2 | 5/2003 | Chiang et al. |
| 6,576,053 | B1 | 6/2003 | Kim |
| 6,576,534 | B1 | 6/2003 | Zhang et al. |
| 6,589,886 | B2 | 7/2003 | Kim et al. |
| 6,627,268 | B1 | 9/2003 | Fair et al. |
| 6,635,571 | B2 | 10/2003 | Joo et al. |
| 6,649,465 | B2 | 11/2003 | Iijima et al. |
| 6,720,260 | B1 | 4/2004 | Fair et al. |
| 6,759,081 | B2 | 7/2004 | Huganen et al. |
| 6,800,542 | B2 | 10/2004 | Kim |
| 6,849,122 | B1 | 2/2005 | Fair |
| 6,878,402 | B2 | 4/2005 | Chiang et al. |
| 6,949,450 | B2 * | 9/2005 | Chiang et al. ............... 438/475 |
| 6,967,154 | B2 | 11/2005 | Meng et al. |
| 7,015,168 | B2 | 3/2006 | Aronowitz et al. |
| 7,166,233 | B2 | 1/2007 | Johnson et al. |
| 7,166,516 | B2 | 1/2007 | Furuhashi et al. |
| 7,211,508 | B2 | 5/2007 | Chung et al. |
| 7,264,846 | B2 | 9/2007 | Chang et al. |
| 7,348,042 | B2 | 3/2008 | Chiang et al. |
| 7,399,357 | B2 | 7/2008 | Sherman |
| 7,422,986 | B2 | 9/2008 | Carpenter et al. |
| 7,625,609 | B2 | 12/2009 | Matsuura |
| 7,871,676 | B2 | 1/2011 | Chiang et al. |
| 7,871,678 | B1 | 1/2011 | Greer et al. |
| 7,897,215 | B1 | 3/2011 | Fair et al. |
| 8,053,372 | B1 | 11/2011 | Greer et al. |
| 8,334,218 | B2 | 12/2012 | Van Nooten et al. |
| 2001/0048981 | A1 | 12/2001 | Suzuki |
| 2001/0054769 | A1 | 12/2001 | Raaijmakers et al. |
| 2002/0045310 | A1 | 4/2002 | Iijima et al. |
| 2002/0068458 | A1 | 6/2002 | Chiang et al. |
| 2002/0076507 | A1 | 6/2002 | Chiang |
| 2002/0104481 | A1 | 8/2002 | Chiang et al. |
| 2002/0127883 | A1 | 9/2002 | Conti et al. |
| 2002/0173054 | A1 | 11/2002 | Kim |
| 2002/0197402 | A1 | 12/2002 | Chiang et al. |
| 2003/0059535 | A1 | 3/2003 | Luo et al. |
| 2003/0161969 | A1 | 8/2003 | Hillard |
| 2004/0105934 | A1 | 6/2004 | Chang et al. |
| 2004/0131796 | A1 | 7/2004 | Miyano et al. |
| 2004/0151844 | A1 | 8/2004 | Zhang et al. |
| 2004/0221798 | A1 | 11/2004 | Sherman |
| 2006/0196418 | A1 | 9/2006 | Lindfors et al. |
| 2007/0087581 | A1 | 4/2007 | Singh et al. |
| 2010/0055342 | A1 | 3/2010 | Chiang et al. |
| 2010/0285667 | A1 * | 11/2010 | Bonilla et al. ............... 438/702 |
| 2012/0083134 | A1 | 4/2012 | Wu et al. |
| 2012/0258602 | A1 | 10/2012 | Subramani et al. |
| 2012/0264291 | A1 | 10/2012 | Ganguli et al. |
| 2012/0321817 | A1 | 12/2012 | Dussarrat et al. |
| 2013/0012003 | A1 | 1/2013 | Haukka et al. |

FOREIGN PATENT DOCUMENTS

| | | |
|---|---|---|
| WO | WO99/01595 | 1/1999 |
| WO | WO 2012/050770 | 4/2012 |
| WO | WO 2012/060940 | 5/2012 |

OTHER PUBLICATIONS

Chiang et al., U.S. Appl. No. 60/251,795, filed Dec. 6, 2000.
US BPAI Order Returning Undocketed Appeal to Examiner dated Jul. 20, 2009, issued in U.S. Appl. No. 10/465,721.
US Examiner's 2nd Answer, dated Aug. 5, 2009, issued in U.S. Appl. No. 10/465,721.
US BPAI Decision on Appeal, dated Oct. 19, 2010, issued in U.S. Appl. No. 10/465,721.
US Final Office Action, dated Jul. 19, 2012, issued in U.S. Appl. No. 12/364,783.
US Office Action, dated Jan. 7, 2013, issued in U.S. Appl. No. 12/364,783.
US Office Action, dated Jul. 18, 2012, issued in U.S. Appl. No. 12/510,922.
US Final Office Action, dated Jan. 30, 2013, issued in U.S. Appl. No. 12/510,922.
PCT International Search Report and Written Opinion dated Apr. 19, 2012, issued in PCT/US2011/052516.
PCT International Preliminary Report on Patentability and Written Opinion dated Apr. 11, 2013 issued in PCT/US2011/052516.
PCT International Search Report and Written Opinion dated Apr. 19, 2012, issued in PCT/US2011/053046.
PCT International Preliminary Report on Patentability and Written Opinion dated May 16, 2013, issued in PCT/US2011/053046.
Bunshah et al., (1982) "Deposition Technologies for Films and Coatings (Developments and Applcations)," *Materials Science Series*, (editor R.F. Bunshah); Noyes Publications, Park Ridge, New Jersey, USA, Excepts Chapters 2-3, pp. 19-82.
Hellund, (1961) "The Plasma State," *Reinhold Publishing Corporation*, New York, excerpt pp. 65-89.
Kim, H., (Nov. 2003) "Atomic layer deposition of metal and nitride thin films: Current research efforts and applications for semiconductor device processing," *J. Va c. Sci. Techno. B*, 21(6):2231-2261.
Mahajan et al., (1993) "Si Atomic Layer Epitaxy Based on $Si_2H_6$ and Remote He Plasma Bombardment," *Thin Solid Films*, 225:177-182.
Van der Voort et al. (1993) "Reaction of $NH_3$ with Trichlorosilylated Silica Gel: A study of the Reaction Mechanism as a Function of Temperature," Journal of the Chemical Society, Faraday Trans. 89(14):2509-2513.
U.S. Office Action dated Dec. 11, 2002 issued in U.S. Appl. No. 09/849,075.
U.S. Notice of Allowance dated Jun. 10, 2003 issued in U.S. Appl. No. 09/849,075.
U.S. Office Action dated Oct. 14, 2008 issued in U.S. Appl. No. 11/520,455.
Office Action dated Dec. 24, 2008 issued in U.S. Appl. No. 11/520,497.
U.S. Appl. No. 11/520,497, "Method of Reducing Plasma Stabilization Time In A Cycle Deposition Process," filed Sep. 12, 2006.
U.S. Office Action dated Feb. 17, 2009 issued in U.S. Appl. No. 11/498,949.
U.S. Office Action dated Jul. 1, 2008 issued in U.S. Appl. No. 11/498,949.
U.S. Appl. No. 11/498,949, "Method of Depositing an elemental film," filed Aug. 2, 2006.
U.S. Office Action dated Dec. 29, 2008 issued in U.S. Appl. No. 11/540,937.
U.S. Appl. No. 11/540,937, "Method for Improving the Nucleation and Morphology of Ruthenium Liners Deposited on Tantalum Nitride," filed Sep. 29, 2006.
U.S. Examiner's Answer dated Apr. 2, 2009 issued in U.S. Appl. No. 10/465,721.
U.S. Pre-Appeal Conference Decision dated Apr. 22, 2008 issued in U.S. Appl. No. 10/465,721.
U.S. Office Action dated Oct. 11, 2007 issued in U.S. Appl. No. 10/465,721.

(56) References Cited

OTHER PUBLICATIONS

U.S. Advisory Action dated Aug. 14, 2007 issued in U.S. Appl. No. 10/465,721.
U.S. Final Office Action dated May 31, 2007 issued in U.S. Appl. No. 10/465,721.
U.S. Office Action dated Dec. 7, 2006 issued in U.S. Appl. No. 10/465,721.
U.S. Advisory Action dated Aug. 17, 2006 issued in U.S. Appl. No. 10/465,721.
U.S. Final Office Action dated Jun. 15, 2006 issued in U.S. Appl. No. 10/465,721.
U.S. Office Action dated Jan. 10, 2006 issued in U.S. Appl. No. 10/465,721.
U.S. Final Office Action dated May 5, 2005 issued in U.S. Appl. No. 10/465,721.
U.S. Office Action dated Nov. 22, 2004 issued in U.S. Appl. No. 10/465,721.
U.S. Advisory Action dated Jul. 9, 2004 issued in U.S. Appl. No. 10/465,721.
U.S. Office Action dated May 4, 2004 issued in U.S. Appl. No. 10/465,721.
U.S. Office Action dated Dec. 11, 2003 issued in U.S. Appl. No. 10/465,721.
U.S. Appl. No. 10/465,721, "Sequential UV induced chemical vapor deposition," filed Jun. 18, 2003.
U.S. Office Action dated May 14, 2009 issued in U.S. Appl. No. 11/520,455.
U.S. Office Action dated Jul. 22, 2009 issued in U.S. Appl. No. 11/540,937.
U.S. Appl. No. 10/600,622, "Sequential UV induced chemical vapor deposition", Fair et al., filed Jun. 20, 2003.
U.S. Notice of Allowance dated Oct. 28, 2003 issued in U.S. Appl. No. 10/600,622.
U.S. Appl. No. 12/364,783, "Selective Plasma Activation Atomic Layer Deposition," filed Feb. 3, 2009.
U.S. Office Action dated Oct. 16, 2009 issued in U.S. Appl. No. 11/520,455.
U.S. Office Action dated Mar. 2, 2010 issued in U.S. Appl. No. 11/520,455.
U.S. Office Action dated May 27, 2010 issued in U.S. Appl. No. 11/520,497.
U.S. Notice of Allowance dated Sep. 14, 2010 issued in U.S. Appl. No. 11/520,455.
U.S. Notice of Allowance dated Oct. 25, 2010 issued in U.S. Appl. No. 10/465,721.
U.S. Office Action dated Dec. 9, 2010 issued in U.S. Appl. No. 11/520,497.
U.S. Office Action dated Apr. 14, 2011 issued in U.S. Appl. No. 11/520,497.
U.S. Notice of Allowance dated Sep. 14, 2011 issued in U.S. Appl. No. 11/520,497.
U.S. Office Action dated Nov. 25, 2011 issued in U.S. Appl. No. 12/364,783.
Mitzel et al., "Are there Structurally Relevant Attrative interactions between Nitrogen Atoms and Group 14 Elements in Their Aminomethyl Compounds?" Organomettallics 18, 1999, pp. 3437-3444.
Milov et al., "Quantum-chemical Investigation of the Hyprevalent Intramolecular Coordination X-N (X=C, Si, Ge) in Quasimonocyclic Models of IVa Group Atrane," Russian Journal of Organic Chemistry, vol. 10, No. 2, 2004, pp. 261-268; translated from Zhurnal Organicheskoi Khimiz, vol. 40, No. 2, 2004, pp. 289-296.
Isopropyl Group. Illustrated Glossary of Organic Chemistry, accessible at http://www.chem.ucla.edu/harding/IGOC/I/isopropyl_group.html.
Walsh, Bond Dissociation Energies in Organosilicon Compounds, online at www.gelest.com/Library/10BondDiss.pdf [created Mar. 31, 2002].
U.S. Appl. No. 13/234,020, "Method of Mitigating Substrate Damage During Deposition Processes," filed Sep. 15, 2011.
US Final Office Action, dated Jul. 30, 2013, issued in U.S. Appl. No. 12/364,783.
Vartanian, Victor, et al. (2002) "Emissions Characterization of Advanced CVD Processes and Abatement Performance," Editor: L. Mendicino, "Environmental Issues with Materials and Processes for the Electronics and Semiconductor Industries V." Pennington: The Electrochemical Society, 1-11. Print. (8pp).
US Office Action, dated Sep. 20, 2013, issued in U.S. Appl. No. 13/234,020.

\* cited by examiner

ION-INDUCED ATOMIC LAYER DEPOSITION OF TANTALUM

CROSS-REFERENCE TO RELATED APPLICATIONS

This application claims benefit under 35 U.S.C. §119(e) to U.S. Provisional Patent Application No. 61/410,285, filed Nov. 4, 2010, to U.S. Provisional Patent Application No. 61/438,497, filed Feb. 1, 2011, and to U.S. Provisional Patent Application No. 61/438,914, filed Feb. 2, 2011, all of which are herein incorporated by reference.

BACKGROUND

In integrated circuit fabrication, metal lines are often in contact with dielectric layers. For example, a trench in a dielectric layer may be formed and then metal deposited in the trench to form a metal line. It may be desirable to use copper, with its low resistivity, to form these metal lines. Copper, however, due to its diffusivity in a dielectric layer, should not be in direct contact with dielectric layers. Therefore, a barrier layer may be deposited on the dielectric layer before depositing copper to separate the copper from the dielectric layer. A commonly used metal barrier layer is tantalum nitride (TaN). Tantalum (Ta) is commonly deposited on a metal barrier layer of tantalum nitride to improve the adhesion of copper. To maximize the amount of copper in the trench so that the electrical line resistance may be reduced, the TaN and Ta layers may be thin and conformal. In some instances, tantalum may be used alone as a metal barrier layer.

SUMMARY

Methods, apparatus, and systems for forming a tantalum layer are provided. According to various implementations, the methods involve depositing a tantalum layer on a surface of a wafer substrate using an ion-induced atomic layer deposition process.

According to one implementation, a method includes depositing a tantalum layer on a surface of a wafer substrate using an ion-induced atomic layer deposition process with a tantalum precursor. In some implementations, copper may be deposited on the tantalum layer with a physical vapor deposition process. In some implementations, before depositing the tantalum layer, a protective layer may be deposited on the surface of the wafer substrate using a process configured to produce substantially less damage in the wafer substrate than a first plasma-assisted deposition process. The protective layer may be less than about 100 Angstroms thick.

According to another implementation, an apparatus includes a process chamber and a controller. The controller includes program instructions for conducting a process including the operation of depositing a tantalum layer on a surface of a wafer substrate using an ion-induced atomic layer deposition process with a tantalum precursor.

According to another implementation, a non-transitory computer machine-readable medium includes program instructions for control of a deposition apparatus. The instructions include code for depositing a tantalum layer on a surface of a wafer substrate using an ion-induced atomic layer deposition process with a tantalum precursor.

These and other aspects of implementations of the subject matter described in this specification are set forth in the accompanying drawings and the description below.

DETAILED DESCRIPTION

Figure 1:
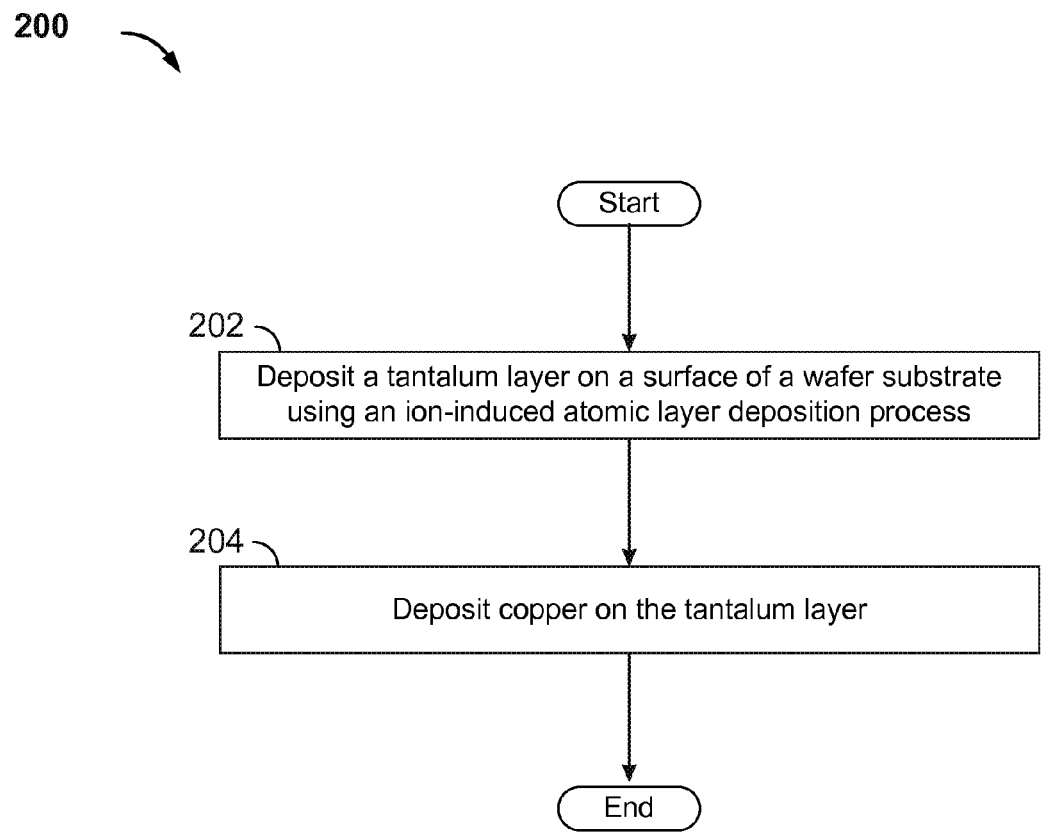
FIG. 1 shows an example of a flow diagram of a method of forming a metal line.

In the following detailed description, numerous specific implementations are set forth in order to provide a thorough understanding of the disclosed implementations. However, as will be apparent to those of ordinary skill in the art, the disclosed implementations may be practiced without these specific details or by using alternate elements or processes. In other instances well-known processes, procedures, and components have not been described in detail so as not to unnecessarily obscure aspects of the disclosed implementations.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. The following detailed description assumes the disclosed implementations are implemented on a wafer. However, the disclosed implementations are not so limited. The work piece may be of various shapes, sizes, and materials. In addition to semiconductor wafers, other work pieces that may take advantage of the disclosed implementations include various articles such as printed circuit boards and the like.

Processes for depositing tantalum (Ta) include ionized physical vapor deposition (iPVD) processes. As the features in integrated circuit devices become smaller (e.g., about 3 nanometers (nm) or less), however, iPVD processes for depositing tantalum may be unable to produce Ta layers with a uniform thickness due to the intrinsically directional nature of iPVD processes. Ta layer non-uniformities also may make it difficult to further reduce the Ta layer thickness. If a Ta layer deposited with iPVD is sufficiently thick, the electrical line resistance may increase and there may be problems with depositing copper on the Ta layer (e.g., defects such as pinch-off and/or post-plating voids). If the Ta layer deposited with iPVD is not thick enough, the lack of copper adhesion may cause failure of the integrated circuit device.

Additionally, it has been observed by the applicants that copper deposited by physical vapor deposition (PVD) processes may agglomerate on Ta layers formed by PVD or iPVD processes when the wafer is heated to about 100 to 300° C. during the copper deposition process. This may result in undesirable overhangs and voids in the copper.

Disclosed herein are processes for forming Ta layers on a wafer substrate. The disclosed processes are particularly applicable for forming conformal Ta layers. In some implementations, Ta layers are formed using an ion-induced atomic layer deposition (iALD) process with a tantalum precursor. Also disclosed are processes for depositing copper by PVD processes on Ta layers deposited by iALD. The copper deposited with PVD may form a seed layer for subsequent electroplating. Alternatively, or in addition, the copper deposited with PVD may partially or fully fill the tantalum coated features on the wafer substrate.

In some implementations, a protective layer may be first deposited on an exposed dielectric material, which may be patterned, on the wafer substrate. Then, tantalum and/or tantalum nitride (TaN) may be deposited using an iALD process. The protective layer may protect the dielectric material from damage potentially caused by the iALD process. iALD processes may have the advantage of producing a Ta and/or a TaN layer with a higher density compared to other deposition methods; a higher density layer may have improved barrier properties. Further, with an iALD process, the properties of the surface of a TaN layer can be engineered, for example, to optimize the adhesion of subsequent layers deposited on the TaN layer.

A Ta layer is deposited using a tantalum precursor. In some implementations, the tantalum precursor may be a tantalum halide based precursor, which may be a liquid or a solid at room temperature and pressure. In some implementations, the tantalum halide based precursor may be tantalum pentachloride or tantalum pentachloride diethyl sulfide (TPDS). Ta layers or tantalum-rich TaN layers may be deposited on TaN barrier layers to improve the adhesion of copper. iALD processes using a tantalum halide based liquid or solid precursor may provide precise Ta layer thickness control, Ta layers with conformal step coverage, Ta layers with good barrier performance, and Ta layers with good adhesion strength with a copper seed layer.

Method

The disclosed implementations include methods of forming a tantalum (Ta) layer on a wafer substrate using an ion-induced atomic layer deposition (iALD) process. In some implementations, a Ta layer may be deposited on a dielectric layer of a wafer substrate using an iALD process. In some implementations, a protective layer may be formed on a dielectric layer of a wafer substrate prior to depositing a Ta layer using an iALD process. In some implementations, a protective layer may be formed on a dielectric layer of a wafer substrate, a barrier layer may be formed on the protective layer using an iALD process, and then a Ta layer may be deposited on the barrier layer using an iALD process.

The dielectric layer may be a high-k or a low-k dielectric. High-k dielectrics include zirconium oxide, hafnium oxide, zirconium silicate, and hafnium silicate, for example. Low-k and ultralow-k dielectrics include carbon doped silicon oxide (SiOC) and low density SiOC based compounds. These dielectric materials may be damaged by bombardment with ions present in an iALD process. Avoiding such damage to dielectric layers on the wafer substrate may be important, as damage to a dielectric material can degrade its electrical properties. In the case of back-end metallization, damage to the low-k dielectric may cause the dielectric constant to increase in capacitance, which may result in an increased resistive-capacitive (RC) delay. In the case of the front-end metallization, damage to the high-k dielectric at a metal/dielectric interface may cause the metal work function to shift which may result in degraded transistor performance. The protective layer of disclosed implementations may serve to protect the dielectric layer from damage during an iALD process.

iALD processes generally produce layers of material having a higher density compared to the density of layers produced with other methods. iALD processes also have further advantages, including providing very conformal layers and a precise control of the thickness of these layers. iALD processes are described in U.S. Pat. Nos. 6,428,859, 6,416,822, and 7,871,678, all of which are herein incorporated by reference. iALD processes are also described in U.S. patent application Ser. No. 11/520,497, titled "METHOD OF REDUCING PLASMA STABILIZATION TIME IN A CYCLIC DEPOSITION PROCESS," filed Sep. 12, 2006, which is herein incorporated by reference.

In some implementations, a Ta layer may serve as a metal barrier layer and may be deposited directly on a dielectric layer using an iALD process. These implementations may be particularly appropriate in the fabrication processes of integrated circuit devices for use as memory devices.

FIG. 1 shows an example of a flow diagram of a method of forming a metal line. At block 202 of the method 200, a Ta layer is deposited on a surface of a wafer substrate using an ion-induced atomic layer deposition process with a tantalum precursor.

In some implementations of iALD processes for depositing a Ta layer, a precursor dose is first admitted to the process chamber. The precursor chemically adsorbs onto the wafer substrate surface. In some implementations the precursor forms about a monolayer of coverage on the wafer substrate surface. Examples of precursors used in iALD processes for tantalum deposition are given below. The excess precursor (i.e., the precursor that is not adsorbed onto the wafer substrate surface) is purged from the process chamber. In some implementations, a mixture of argon and hydrogen gasses may be used to purge the excess precursor from the process chamber. RF power is then applied to the argon and hydrogen gasses, forming argon ions and hydrogen radicals. iALD processes may use plasmas generated with about 100 to 700 Watts (W) RF power, greater than about 300 W RF power, about 350 to 450 W RF power, or about 450 W RF power. The argon ions provide energy to induce a chemical reaction between the adsorbed tantalum precursor and the hydrogen precursor, forming a monolayer of tantalum. Finally, the chamber is purged to remove any chemical byproducts. This process is repeated until the desired thickness of the Ta layer is formed. In some implementations, the deposited Ta layer may be at least about one monolayer thick, about 3 to 50 Angstroms thick, about 5 to 20 Angstroms thick, or less than about 50 Angstroms thick. Tables I and II list process conditions (i.e., time for each step in the process and the associated RF power) for some implementations of an iALD process for depositing a Ta layer.

TABLE I

Approximate process condition ranges for some implementations of an iALD process for depositing a Ta layer.

|  | RF power (W) | Time (s) |
| --- | --- | --- |
| Precursor dose | 0 to 100 | 0.5 to 5 |
| Precursor Purge | 0 | 0.5 to 10 |
| Plasma exposure | 100 to 700 | 0.5 to 5 |
| Post-plasma purge | 0 | 0.1 to 10 |

TABLE II

Approximate process conditions for certain implementations of an iALD process for depositing a Ta layer.

|  | RF power (W) | Time (s) |
| --- | --- | --- |
| Precursor dose | 0 | 2 |
| Precursor Purge | 0 | 2.5 |
| Plasma exposure | 450 | 4 |
| Post-plasma purge | 0 | 1.5 |

It should be understood that an iALD deposited Ta layer as described herein may be a tantalum-rich compound such as tantalum-rich tantalum nitride or a tantalum-rich tantalum carbide (TaC). Tantalum-rich compounds may have greater than a stoichiometric amount of tantalum or may comprise a mixture of the tantalum compound and metallic tantalum. For example, the tantalum-rich compound may be a super-stoichiometric tantalum compound and/or a mixture of the tantalum compound and metallic tantalum. It should be noted that iALD formed Ta layers are typically not pure tantalum, but rather a combination of tantalum and tantalum carbide, where the carbon composition may be about 0 to 40 atomic percent, depending on the tantalum precursor and deposition conditions. For example, in one experiment, an XPS/AES analysis the Ta layer deposited using tantalum pentachloride diethyl sulfide (TPDS) contained about 35 atomic percent carbon. Generally, carbon-free tantalum precursors may produce a Ta layer with relatively little tantalum carbide, but some tantalum carbide still may be present. This may be due to carbon residues inside the deposition chamber, for example.

In some implementations, the tantalum precursor is a tantalum halide. Tantalum halides include, for example, $TaF_5$, $TaCl_5$, $TaBr_5$, $TaI_5$, and tantalum pentachloride diethyl sulfide (TPDS). Other tantalum halides include a tantalum halide alkyl sulfide, tantalum pentachloride dialkyl sulfide, or a tantalum pentahalide diethyl sulfide. In some implementations, the tantalum halide is a liquid at room temperature and pressure. For example, TPDS is a liquid at room temperature and pressure. Of course, a solid precursor such as $TaCl_5$ can be used as well as the liquid precursors.

Further, other tantalum-containing precursors may be used to deposit the Ta layer. For example, in some other implementations, the tantalum precursor is terbutylimido-tris(diethylamino) tantalum (TBTDET). Further implementations use other tantalum-amine complexes for a tantalum precursor, including pentakis(dimethylamino) tantalum (PDMAT), t-butylamino-tris(diethylamino) tantalum (TDBDET), pentakis(diethylamido) tantalum (PDEAT), pentakis(ethylmethylamido) tantalum (PEMAT), and imidotris(dimethylamido) tantalum (TAIMATA).

Returning to the method 200 shown in FIG. 1, at block 204, after depositing the Ta layer, copper is deposited on the Ta layer. The copper deposited on the Ta layer may reflow to follow the contours of the wafer substrate. For example, the wafer substrate may include features of a size of about 3 nm or less. Features of a size of about 3 nm or less may have at least one dimension, such as the opening of the feature, for example, of about 3 nm or less. When copper deposited with PVD is integrated with a Ta layer deposited with iALD, the copper can be deposited on the Ta layer with little or no agglomeration, particularly at higher temperatures, for example, at about 200 to 300° C. Note that depositing copper with PVD is conventionally carried out at a much lower temperature, for example, at about negative 40° C. (−40° C.).

In some implementations, copper may be deposited with PVD using a hollow cathode magnetron (HCM). The hollow cathode magnetron may be at a DC power of about 50 to 90 kilowatts (kW) (e.g., about 70 kW) with argon flowing at about 0.5 to 4 standard cubic centimeters per minute (sccm) or at about 1.5 to 3 sccm. In some other implementations, other devices may be used to deposit copper with PVD, such as a cathode planar magnetron or other magnetron sputter deposition system.

In contrast, copper deposited with PVD has a tendency to agglomerate on a Ta layer deposited with PVD when the wafer is heated to about 100 to 300° C. Copper agglomeration may be manifest by one or more conditions, most notably, for example, by local regions of copper pooling or copper thickness increases on or within a wafer substrate feature. Agglomeration may produce an overhang and/or a pinch-off near a feature entrance as well as rough film morphology on the feature sidewall. The size of copper agglomerates may depend on the feature shape and size and process conditions used to deposit the copper. Generally, an agglomerate will be relatively small in comparison to sidewalls or other components of the feature.

Copper deposited on a Ta layer deposited with PVD also may reflow to follow the contours of the device features when the copper is deposited at high ion energies, but high ion energies may damage the Ta layer.

In some implementations, the wafer onto which copper is to be deposited may be preheated prior to insertion in the deposition chamber. Copper deposition at an elevated temperature onto a Ta layer deposited with iALD may provide a significant enhancement over copper deposition onto a Ta layer deposited with PVD. For example, in one experiment, the reflow of copper was observed without the formation of overhangs, even when the copper was deposited with a low ion energy.

Further, as device structures scale down to 3 nm and smaller, gap fill by electroplating becomes more challenging. In these size regimes, the copper flow described herein may enable complete filling of a feature simply by the deposition copper with PVD, thus eliminating or greatly reducing the need for electroplating. When a feature is filled with copper deposited with PVD, copper plating may still be needed to form overburden prior to planarization, however.

The Ta layer deposited using iALD on which copper is deposited may be pure metallic tantalum or a tantalum-rich compound, as described above. The presence of carbon or other non-tantalum element in the Ta layer may facilitate copper deposition in a manner that resists agglomeration.

In summary, when copper deposited with PVD is integrated with tantalum deposited with iALD, copper reflow can be enhanced even at a relatively low temperatures. These low temperatures make the processes described herein to the back-end-of-line processing.

Figure 2:
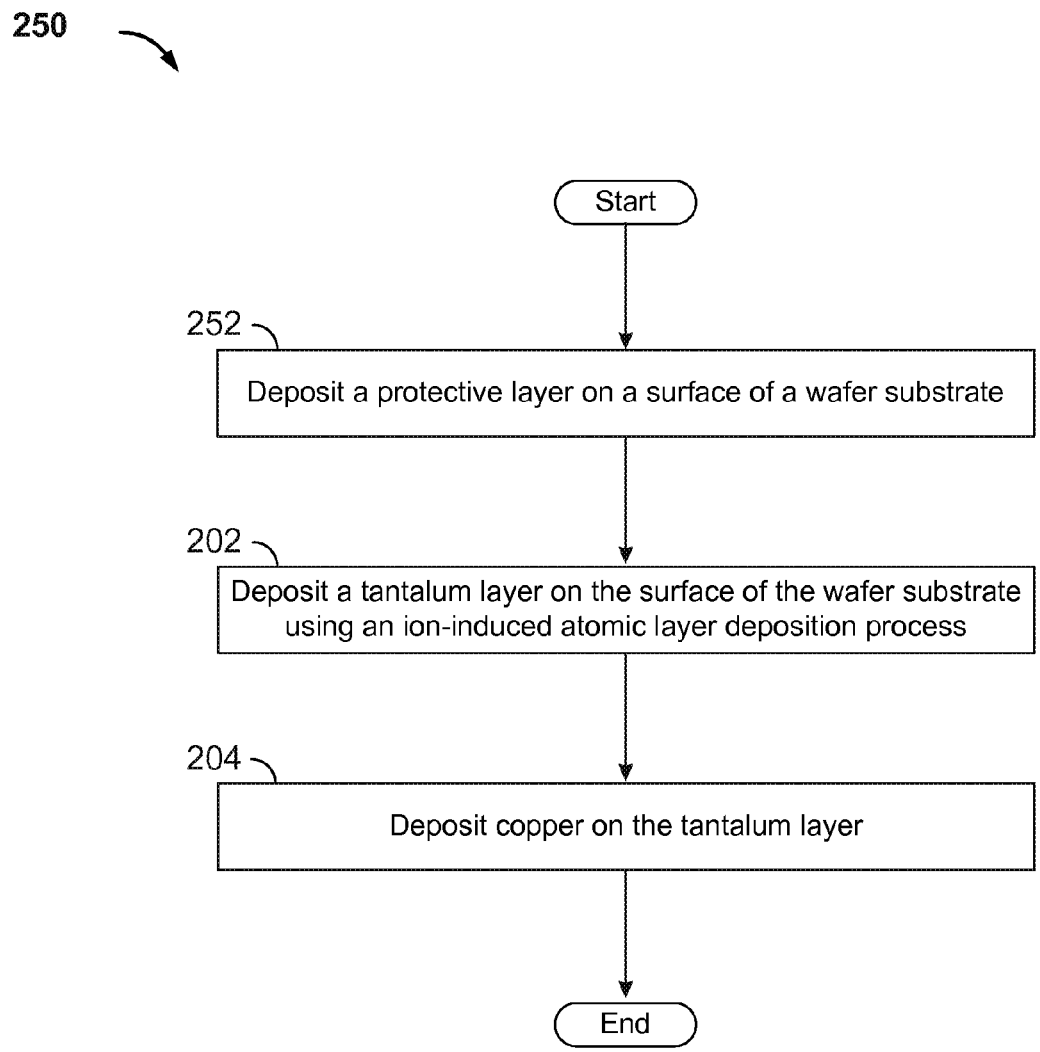
FIG. 2 shows an example of a flow diagram of a method of forming a metal line.

FIG. 2 shows an example of a flow diagram of a method of forming a metal line. Implementations of the method 250 shown in FIG. 2 may be similar to the method 200 shown in FIG. 1, with the addition of block 252. At block 252, before depositing a Ta layer on a surface of a wafer substrate using an iALD process, a protective layer is deposited on the surface of the wafer substrate. The protective layer may be deposited using a number of different processes. In some implementations, the method of depositing the protective layer may produce substantially less damage to a wafer substrate than a plasma-assisted process such as an iALD process or a plasma enhanced chemical vapor deposition (PECVD) process. The deposition process may yield good step coverage in the features of the wafer substrate. For example, the protective layer may be deposited with a thermal ALD process, a thermal chemical vapor deposition (CVD) process, a low-power PECVD process, a remote-plasma PECVD process, or a sputtering process.

In some implementations the protective layer may be deposited with a thermal ALD process. Thermal ALD processes are usually performed with two different chemicals or precursors and are based on sequential, self-limiting surface reactions. The precursors are sequentially admitted to a reaction chamber in a gaseous state where they contact the surface of the wafer substrate. For example, a first precursor is adsorbed onto the surface when it is admitted to a reaction chamber. Then, the first precursor reacts with a second precursor at the surface when the second precursor is admitted to the reaction chamber. By repeatedly exposing a surface to alternating sequential pulses of the precursors, a thin film of the protective material is deposited. Thermal ALD processes also include processes in which a surface is exposed to sequential pulses of a single precursor, which also may deposit a thin film of the protective material on the surface. Thermal ALD generally forms a conformal layer, i.e., a layer that faithfully follows the contours of the underlying surface. By exposing the precursors to a surface repeatedly, a thin protective layer may be deposited. The final thickness of the protective layer depends on the thickness of the precursor absorption layer as well as the number of precursor exposure cycles. A general description of thermal ALD processes and apparatus is given in U.S. Pat. No. 6,878,402, which is herein incorporated by reference.

In some other implementations, the protective layer may be deposited using a low-power PECVD process. In low-power PECVD processes, a radio frequency (RF) power is applied to sustain a plasma discharge when depositing a protective layer, in some implementations. A dual frequency PECVD system with both high and low frequency radio power supplies can also be used. Low-power PECVD processes utilize a plasma to enhance chemical reaction rates of the precursors. Some low-power PECVD processes allow for the deposition of a material using a low-power RF power, which may result in little of no damage to an exposed dielectric layer on a wafer substrate surface.

In some implementations in which the protective layer is deposited using a low-power PECVD process, the plasma is a low-power plasma. The RF power used to generate the plasma may be applied at a power of less than about 100 W for a 300 millimeter wafer substrate, in some implementations. In some implementations, the RF power used to generate the plasma may be about 25 W to 150 W. In some implementations, the RF power used to generate the plasma may be about 50 W. A general description of PECVD processes and apparatus in which a low-power plasma may be used is given in U.S. patent application Ser. No. 12/070,616, entitled "PLASMA PARTICLE EXTRACTOR FOR PECVD," and filed Feb. 19, 2008, which is herein incorporated by reference.

In some implementations, the protective layer may be deposited using a remote-plasma PECVD process or a remote-plasma ALD process. In a remote-plasma PECVD process or a remote-plasma ALD process, the plasma may be generated with a remote plasma source. The use of a plasma generated with a remote-plasma source may minimize or substantially eliminate damage to the wafer substrate that may be caused by a plasma. Remote-plasma PECVD processes and remote-plasma ALD processes are similar to direct PECVD processes except that the work piece (e.g., the wafer substrate) is not directly in the plasma source region. The plasma source is upstream from the wafer substrate, and activates and/or disassociates precursor species to form reactive ions and radicals. Reducing gasses, including ammonia and hydrogen, are also dissociated into reactive ions and radicals within the remote plasma source in some implementations. In some implementations a showerhead and a faceplate can be used to filter out ions such that only radicals reach the wafer substrate surface. Radicals may cause little damage to an ultralow-k dielectric. Further, removing the wafer substrate from the area of the plasma source may allow for processing temperatures down to about room temperature. A general description of remote-plasma PECVD processes and apparatus is given in U.S. Pat. No. 6,616,985 and U.S. Pat. No. 6,553,933, both of which are herein incorporated by reference. As noted above, a remote-plasma source also may be used in ALD-type processes for the deposition of a protective layer in some implementations.

In some implementations, the protective layer may be tantalum nitride. Tantalum nitride used as a protective layer may contribute to the barrier layer properties of tantalum subsequently deposited by iALD. In some other implementations, the protective layer may be a layer of a metal (e.g., tantalum, ruthenium (Ru), titanium (Ti), or tungsten (W)), a layer of a metal nitride (e.g., titanium nitride (TiN) or tungsten nitride (WN)), or a layer of a metal carbide, for example.

In some implementations, the protective layer may be at least about one monolayer thick. In implementations where tantalum nitride is used for the protective layer, the TaN layer may be at least about 3 Angstroms thick. In some other implementations the protective layer may be about 3 to 30 Angstroms thick, about 5 Angstroms thick, or less than about 100 Angstroms thick. In some other implementations, the protective layer may be about 40, 50, or even 100 Angstroms thick. One monolayer of the protective layer may be sufficient to prevent damage to an underlying dielectric during subsequent iALD processes. If the protective layer is too thick, there may be insufficient room in the feature into which iALD tantalum and copper, for example, may be deposited.

In some implementations, after the operation of depositing a protective layer on a surface of a wafer substrate, the protective layer is treated. The protective layer treatment may increase the density of the protective layer or adhesion of the barrier layer to the protective layer, for example. Examples of protective layer treatments include exposing the protective layer to elevated temperatures (i.e., a thermal anneal), to a plasma or species from a remote plasma (e.g., to increase the density of the protective layer), to a reducing atmosphere (e.g., an atmosphere of argon and ammonia or an atmosphere of hydrogen and ammonia), or to the vacuum of the process chamber in which the protective layer was deposited.

Further description of protective layers is given in U.S. patent application Ser. No. 13/234,020, titled "METHOD OF MITIGATING SUBSTRATE DAMAGE DURING DEPOSITION PROCESSES," filed Sep. 15, 2011, which is herein incorporated by reference.

Returning to FIG. 2, the method 250 continues with block 202 and 204, as described above. At block 202, a Ta layer is deposited on a surface of a wafer substrate using an ion-induced atomic layer deposition process with a tantalum precursor. At block 204, copper is deposited on the Ta layer.

Apparatus

Another aspect of the implementations disclosed herein is an apparatus configured to accomplish the methods described herein. A suitable apparatus includes hardware for accomplishing the process operations and a system controller having instructions for controlling process operations in accordance with the disclosed implementations. Hardware for accomplishing the process operations includes ALD processing chambers, iALD processing chambers, PECVD processing chambers, PVD processing chambers, and iPVD processing chambers. The system controller will typically include one or more memory devices and one or more processors configured to execute the instructions so that the apparatus will perform a method in accordance with the disclosed implementations. Machine-readable media containing instructions for controlling process operations in accordance with the disclosed implementations may be coupled to the system controller.

Figure 3:
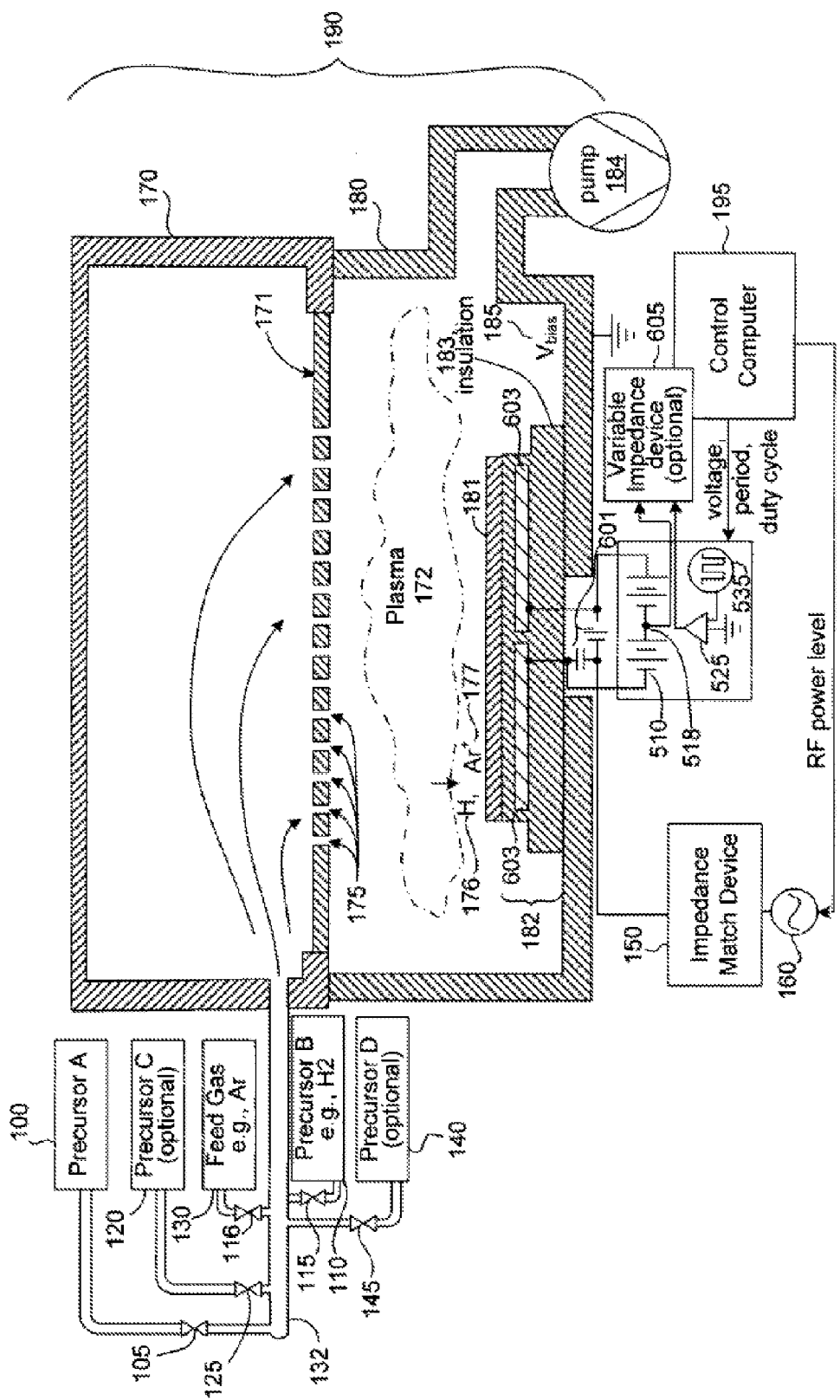
FIG. 3 shows an example of a schematic diagram of a system suitable for ion-induced atomic layer deposition (iALD) processes.

FIG. 3 shows a schematic diagram of a system suitable for atomic layer deposition (ALD) and ion-induced atomic layer deposition (iALD) processes. In the system of FIG. 3, all of the ion/radical generating feed gases and the precursor gases are introduced into a main body chamber 190 via a distribution showerhead 171 including of a series of arrays or apertures 175. However, other means for uniformly distributing gases essentially parallel or perpendicular to a face of a substrate 181 may also be used. Although the showerhead 171 is shown to be above the substrate 181 to direct a gas flow downwards towards the substrate 181, alternative lateral gas introduction schemes are possible. Various lateral gas introduction schemes are described in U.S. patent application Ser. No. 10/215,711, filed Aug. 8, 2002, which is herein incorporated by reference.

In the implementation of the system shown in FIG. 3, a source of RF bias power 160 is coupled to one or more electrostatic chuck (ESC) electrodes 603 in a substrate pedestal 182, which includes insulation 183, via an impedance matching device 150. The ESC electrodes 603 may be of any arbitrary shape. The RF bias power provides power for both ion generation during iALD and energy control of the generated ions. The applied RF bias power is used to generate a plasma 172 in a main process chamber 180, for example, between the substrate 181 and the showerhead 171 to dissociate feed gasses 110 and 130 to generate ions 177 and radicals 176 and to induce a negative potential $V_{bias}$ 185 (i.e., a DC offset voltage typically about −10 V to −80 V at less than or equal to about 475 W RF power and about 0.1 to 5 Torr pressure) on the substrate 181. The negative potential $V_{bias}$ 185 modulates the energy of the positively charged ions in the plasma and attracts the positively charged ions toward the surface of the substrate. The positively charged ions impinge on the substrate 181, driving the deposition reaction and improving the density of the deposited film. The ion energy is more specifically given by $E=e|V_p|+e|V_{bias}|$, where $V_p$ is the plasma potential (typically about 10V to 20V) and $V_{bias}$ is the negative potential $V_{bias}$ 185 induced on the substrate 181. The negative potential $V_{bias}$ 185 is controlled by the applied RF bias power. For a given process region geometry, the induced negative potential $V_{bias}$ 185 increases with increasing RF bias power and decreases with decreasing RF bias power.

Controlling the RF bias power also controls the density and hence the number of ions generated in the plasma. Increasing the RF bias power generally increases the ion density, leading to an increase in the flux of ions impinging on the substrate. Higher RF bias powers are also required for larger substrate diameters. In some processes, a power density less than or equal to about 0.5 W/cm² may be used, which equates to less than or equal to about 150 W for an about 200 mm diameter substrate. Power densities greater than or equal to about 3 W/cm² (i.e., greater than about 1000 W for a 200 mm diameter substrate) may lead to undesired sputtering of the deposited film.

The frequency of the RF bias power can be about 400 kHz, about 13.56 MHz, or higher (e.g., about 60 MHz, etc.). A low frequency (e.g., about 400 kHz), however, can lead to a broad ion energy distribution with high energy tails which may cause excessive sputtering. The higher frequencies (e.g., about 13.56 MHz or greater) may lead to tighter ion energy distributions with lower mean ion energies, which may be favorable for iALD processes. The more uniform ion energy distribution occurs because the RF bias polarity switches before ions can impinge on the substrate, such that the ions see a time-averaged potential.

As shown in FIG. 3, a source of applied DC bias can also be coupled to the ESC substrate pedestal 182. The source can be a DC power supply 510 coupled by a center tap 518 to a voltage source 525 with the ability to vary the voltage or exhibit an infinite impedance. Optionally, a variable impedance device 605 may be coupled in series between the voltage source 525 and the center tap 518 of the DC power supply 510. The voltage source 525 is itself coupled to a waveform generator 535. The waveform generator may be a variable-type waveform generator. A variable-type waveform generator may be controlled by a control computer 195 and have a variable waveform at different times within a given process and may additionally have a non-periodic output signal. The source of applied DC bias can be coupled to the ESC substrate pedestal 182 by RF blocking capacitors 601 that both provide a DC open for the DC power supply 510 and prevent RF energy from corrupting the DC power supply 510.

In iALD, the same plasma is used to generate both ions 177 (used to drive the surface reactions) and radicals 176 (used as the second reactant). The iALD system utilizes ion imparted kinetic energy transfer rather than thermal energy to drive the deposition reaction. Since temperature can be used as a secondary control variable, with this enhancement films can be deposited using iALD at arbitrarily low substrate temperatures (generally less than about 350° C.). In particular, films can be deposited at or near room temperature (i.e., about 25° C.) or below.

The system of FIG. 3 contains a substantially enclosed chamber 170 located in substantial communication with or substantially within a main chamber body 190. The feed gasses 110 and 130 are delivered to the plasma source chamber 170 via valving 115 and 116, and a gas feed line 132. Typical feed gases 130 used for ion generation include, but are not restricted to, Ar, Kr, Ne, He, and Xe. Typical feed gases 110 (e.g., precursor B) used for radical generation include, but are not restricted to $H_2$, $O_2$, $N_2$, $NH_3$, and $H_2O$ vapor. The ions 177 are used to deliver the energy needed to drive surface reactions between the first adsorbed reactant and the generated radicals 176.

Gaseous reactants 100 (e.g., precursor A), 120 (e.g., precursor C), and 140 (e.g., precursor D) may be used to form a desired layer. The first reactant 100 (e.g., precursor A) may be introduced to the chamber 170 via valving 105 and the gas feed line 132. The second reactant 120 (e.g., precursor C) may be introduced to the chamber 170 via valving 125 and the gas feed line 132. The third reactant 140 (e.g., precursor D) may be introduced to the chamber 170 via valving 145 and the gas feed line 132. The chamber 180 may be evacuated with a vacuum pump 184. iALD systems and methods are further described in U.S. Pat. No. 6,416,822 and U.S. Pat. No. 6,428,859.

Further Implementations

The apparatus and processes described herein may be used in conjunction with lithographic patterning tools or processes, for example, for the fabrication or manufacture of semiconductor devices, displays, LEDs, photovoltaic panels, and the like. Typically, though not necessarily, such apparatus and processes will be used or conducted together in a common fabrication facility. Lithographic patterning of a film typically comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper. Such processing may be employed, for example, to pattern the dielectric layers on which the tantalum nitride, tantalum, and/or copper layers are deposited, as described above.

What is claimed is:

1. A method comprising:
   (a) depositing a protective layer on a surface of a wafer substrate, the surface comprising an exposed dielectric, by a method other than ion-induced atomic layer deposition, wherein the method is configured to produce substantially less damage in the dielectric than ion-induced atomic layer deposition; and (b) depositing a tantalum containing layer on the surface of the wafer substrate after the protective layer has been deposited, using an ion-induced atomic layer deposition process with a tantalum precursor, wherein the ion-induced atomic layer deposition process comprises forming ions from a feed gas adjacent to the wafer substrate surface in a process chamber housing the wafer substrate.

2. The method of claim 1, wherein the tantalum containing layer is selected from the group consisting of a layer of metallic tantalum, a layer of a tantalum-rich tantalum compound, and a layer of metallic tantalum mixed with a tantalum compound.

3. The method of claim 1, wherein the tantalum containing layer comprises a conformal layer.

4. The method of claim 1, wherein the tantalum precursor comprises a tantalum halide.

5. The method of claim 4, wherein the tantalum halide comprises tantalum pentachloride diethyl sulfide.

6. The method of claim 4, wherein the tantalum halide is a liquid or a solid at room temperature and pressure.

7. The method of claim 1, wherein the dielectric is selected from the group consisting of hafnium oxide, zirconium oxide, zirconium silicate, hafnium silicate and a SiOC-based material.

8. The method of claim 1, wherein the tantalum containing layer is at least about one monolayer thick.

9. The method of claim 1, wherein the tantalum containing layer is about 3 to 50 Angstroms thick.

10. The method of claim 1, wherein the tantalum containing layer is less than about 50 Angstroms thick.

11. The method of claim 1, further comprising:
(c) depositing copper on the tantalum containing layer.

12. The method of claim 11, wherein the copper is deposited using a physical vapor deposition process.

13. The method of claim 11, wherein the copper is deposited at a temperature of about 200 to 300° C.

14. The method of claim 11, wherein the wafer substrate includes features of a size of about 3 nm or less.

15. The method of claim 14, wherein the copper is deposited using a physical vapor deposition process and the copper completely fills the features.

16. The method of claim 1, wherein the protective layer comprises a material selected from the group consisting of a metal, metal nitride, and metal carbide, and wherein the protective layer is deposited by a method selected from the group consisting of thermal atomic layer deposition, thermal chemical vapor deposition, low power PECVD, a remote-plasma PECVD and sputtering.

17. The method of claim 1, further comprising:
applying photoresist to the wafer substrate;
exposing the photoresist to light;
patterning the photoresist and transferring the pattern to the wafer substrate; and
selectively removing the photoresist from the wafer substrate.

* * * * *